(12) United States Patent
Cao et al.

(10) Patent No.: US 6,765,280 B1
(45) Date of Patent: Jul. 20, 2004

(54) LOCAL OXIDATION OF A SIDEWALL SEALED SHALLOW TRENCH FOR PROVIDING ISOLATION BETWEEN DEVICES OF A SUBSTRATE

(75) Inventors: Min Cao, Mountain View, CA (US); Paul J. Vande Voorde, San Mateo, CA (US); Wayne M. Greene, Los Gatos, CA (US); Malahat Tavassoli, Los Altos, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/217,740

(22) Filed: Dec. 21, 1998

(51) Int. Cl.[7] .............................................. H01L 29/00
(52) U.S. Cl. ...................................... 257/510; 257/513
(58) Field of Search ................................. 257/510, 511, 257/513, 512, 514–517, 374; 438/424, 426, 427, 439, 431, 435, 425

(56) References Cited

U.S. PATENT DOCUMENTS

| | | | | |
|---|---|---|---|---|
| 4,502,913 A | * | 3/1985 | Lechaton et al. ............ 156/643 |
| 4,551,743 A | * | 11/1985 | Murakami ..................... 357/50 |
| 4,685,198 A | * | 8/1987 | Kawakita et al. ............ 438/410 |
| 5,057,450 A | * | 10/1991 | Bronner et al. ................ 437/62 |
| 5,221,857 A | * | 6/1993 | Kano ............................ 257/539 |
| 5,686,344 A | * | 11/1997 | Lee ............................... 438/425 |
| 5,747,866 A | * | 5/1998 | Ho et al. ...................... 257/506 |
| 5,914,523 A | * | 6/1999 | Bashir et al. ................ 257/520 |
| 5,976,950 A | * | 11/1999 | DiSimone et al. ........... 438/432 |

* cited by examiner

*Primary Examiner*—Eddie Lee
*Assistant Examiner*—Douglas W. Owens

(57) ABSTRACT

A semiconductor isolation structure. The semiconductor isolation structure includes a substrate. A first device and a second device are formed within the substrate. An isolation region is formed within the substrate between the first device and the second device. The isolation region includes a deep region which extends into the substrate. The deep region includes a deep region cross-sectional area. A shallow region extends to the surface of the substrate. The shallow region includes a shallow region cross-sectional area. The deep region cross-sectional area is greater than the shallow region cross-sectional area. For an alternate embodiment, the deep region includes an oxide and the shallow region includes a protective wall. The protective wall can be formed from an oxide and a nitride.

5 Claims, 5 Drawing Sheets

LOCAL OXIDATION OF A SIDEWALL SEALED SHALLOW TRENCH FOR PROVIDING ISOLATION BETWEEN DEVICES OF A SUBSTRATE

FIELD OF INVENTION

This invention relates generally to semiconductor device isolation. In particular, it relates to local oxidation of a sidewall sealed shallow trench for providing isolation between devices formed in a substrate.

BACKGROUND

Integrated circuits include substrates which generally include active devices formed in proximity to each other. Increasing the density of active devices included on a substrate requires the active devices to be formed more closely to each other. If the active devices are too close to each other, the active devices can electrically connect to each other. Alternatively, signals from one active device can couple to a neighboring active device. This coupling or crosstalk can degrade the performance of the active devices. Therefore, typically some type of isolation structure must be formed between active devices to prevent the active devices from being electrically connected and to prevent coupling of signals between the active devices.

FIG. 1 shows a first type of isolation structure 8 typically used to isolate active devices of a substrate 10. The isolation structure 8 shown in FIG. 1 is formed using a local oxidation of silicon (LOCOS) technique. LOCOS isolation structures include the surface of an active semiconductor substrate 10 being oxidized between active device regions 12, 14 of the semiconductor substrate 10 surface to help prevent electronic interactions between adjacent active device regions 12, 14.

The effectiveness of LOCOS isolation structures degrades significantly as the active device regions 12, 14 become closer together due to parasitic currents that can develop between adjacent devices 12, 14 beneath the LOCOS structures. Additionally, the LOCOS isolation structure 8 is too wide to allow the active device regions 12, 14 to be formed too close to each other.

FIG. 2 shows a second type of isolation structure typically used to isolate active device regions 24, 26 of a substrate 20. The isolation structure shown in FIG. 2 is formed by etching a trench 22 in a silicon substrate 20 between the active device regions 24, 26, and filling the trench 22 with an isolation material such as silicon oxide. Generally, the deeper the trench 22, the greater the isolation between the active device regions 24, 26. Generally, the narrower the trench 22, the closer the active device regions 24, 26 can be with respect to each other. However, if the trench 22 is deep and narrow, the trench 22 can be very difficult to form. That is, deep narrow trenches can be difficult to properly fill with an isolation material.

It is desirable to have a substrate isolation structure which allows active device regions of the substrate to be formed close to each other while still maintaining isolation between the active device regions. It is desirable that the substrate isolation structure provide more isolation between the active device regions than LOCOS isolation and trench isolation structures.

SUMMARY OF THE INVENTION

The present invention is a substrate isolation method and structure which allows active device regions of the substrate to be formed close to each other while still maintaining isolation between the active device regions. The substrate isolation structure provides more isolation between the active device regions than LOCOS isolation and trench isolation structures.

A first embodiment of this invention includes a semiconductor isolation structure. The semiconductor isolation structure includes a substrate. A first device and a second device are formed within the substrate. An isolation region is formed within the substrate between the first device and the second device. The isolation region includes a deep region which extends into the substrate. The deep region includes a deep region cross-sectional area. A shallow region extends to the surface of the substrate. The shallow region includes a shallow region cross-sectional area. The deep region cross-sectional area is greater than the shallow region cross-sectional area.

A second embodiment includes a semiconductor isolation structure. The semiconductor isolation structure includes a substrate. A first device and a second device are formed within the substrate. An isolation region is formed within the substrate between the first device and the second device. The isolation region includes an deep region which extends into the substrate. The deep region includes an oxide. A shallow region extends to the surface of the substrate. The shallow region includes a protective wall. The protective wall can be formed from an oxide and a nitride.

A third embodiment includes a method of forming an isolation structure within a substrate. The method includes forming a trench in the substrate. A protective wall layer is formed within the trench. A bottom portion of the protective wall layer is removed exposing a surface of the substrate. The exposed surface of the substrate is directly oxidized. Finally, the trench is filled with an isolation material. The isolation material can be an oxide.

A fourth embodiment is similar to the third embodiment. The step of removing a bottom portion of the protective wall layer exposing a surface of the substrate of the fourth embodiment includes removing the bottom portion of the protective wall layer exposing the substrate, and forming a second trench in the exposed substrate forming an exposed surface.

Other aspects and advantages of the present invention will become apparent from the following detailed description, taken in conjunction with the accompanying drawings, illustrating by way of example the principles of the invention.

DETAILED DESCRIPTION

Figure 1:
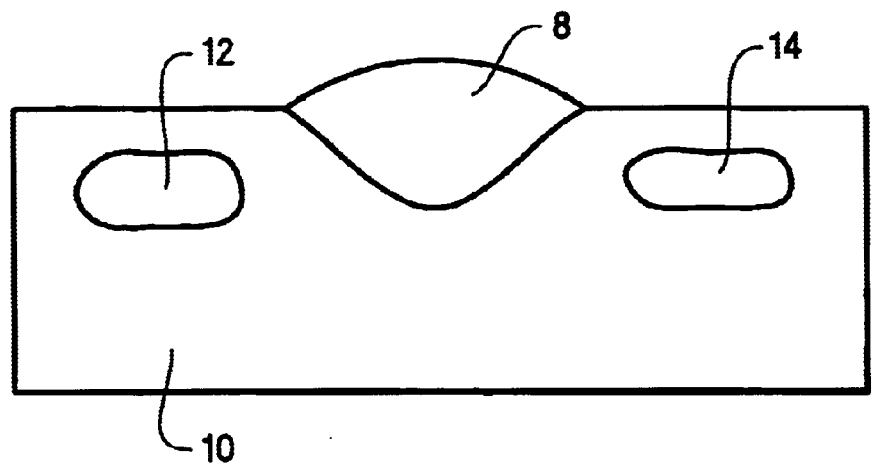
FIG. 1 shows a prior art LOCOS isolation structure.
Figure 2:
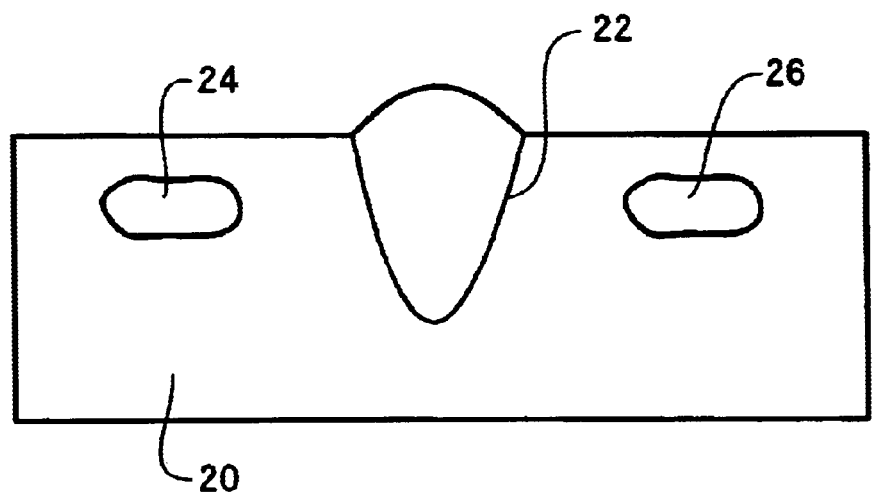
FIG. 2 shows a prior art trench isolation structure

As shown in the drawings for purposes of illustration, the invention is embodied in a method and structure for isolating active device regions of a substrate. The isolation structure of the invention provides for an isolation structure which is deeper than LOCOS or trench isolation structures. The isolation structure includes a unique shape which increase the isolation provided by the isolation structure.

Figure 3:
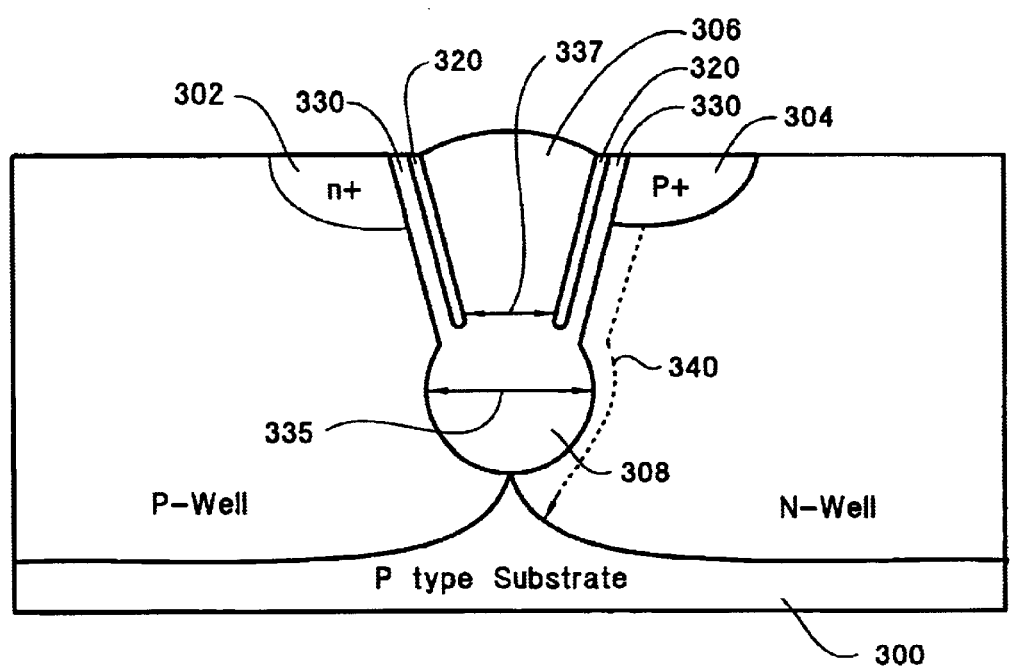
FIG. 3 shows an embodiment of the invention.

FIG. 3 shows an embodiment of the invention. This embodiment includes a isolation region formed in a substrate 300. The isolation region includes a deep region 308 and a shallow region 306. Generally, the isolation region is formed between active device regions 302, 304 of the substrate 300.

The shallow region 306 extends to the surface of the substrate 300. The shallow region 306 includes a wall which generally includes a first wall material 320 and a second wall material 330. The existence of the wall is a result of the unique processing steps used to form the isolation region. The unique processing steps provide the unique structure of the isolation region according to the invention. The presence of the wall allows for formation of a deeper isolation region than prior art LOCOS and prior art trench isolation structures.

Generally, the first wall material 320 consists of a silicon nitride material. Generally, the second wall material 330 consists of an oxide material. Other types of materials can be used for the first wall material 320 and the second wall material 330.

The first wall material 320 provides a sealing function which is utilized during the fabrication of the isolation region to allow for the fabrication of the deep region 308. Fabrication of the deep region 308 will be discussed later.

The second wall material 330 provides stress relief between the silicon nitride first wall 320 and the substrate 300. The second wall material 330 also provides a low defect density between the second wall and the substrate 300. Without the second wall material 330, the silicon nitride first wall 320 would directly contact the substrate 300, which is undesirable?

The formation of the deep region 308 provides for a deeper isolation structure than presently existing isolation structures. In addition, the deep region 308 includes a deep region cross-sectional area 335 which can be larger than a shallow region cross-sectional area 337 of the shallow region 306. The deep region cross-sectional area 335 of the deep region 308 being larger than the shallow region cross-sectional area 337 of the shallow region 304 improves the isolation between the active device regions 302, 304.

A dashed line 340 of FIG. 3 shows the path of leakage current between a p-doped active device region 304 and a P-type substrate 300. Without thee unique wide deep region cross-sectional area 335 of the deep region 308 of the invention, the length of the dashed line 340 representing the path of the leakage current would be much shorter. The result being reduced isolation between the active device regions 302, 304.

The embodiment shown in FIG. 3 includes a P-type substrate, an N-well, a P-well, a p-doped active device region 304 and an n-doped active device region 302. This configuration is shown merely as an example of the type of active device regions the isolation structure according to the invention can be used to isolate. The isolation structure of the invention can be used to isolate other types of active device regions as well.

FIGS. 4–9 show processing steps which may be used to form the embodiment shown in FIG. 3.

Figure 4:
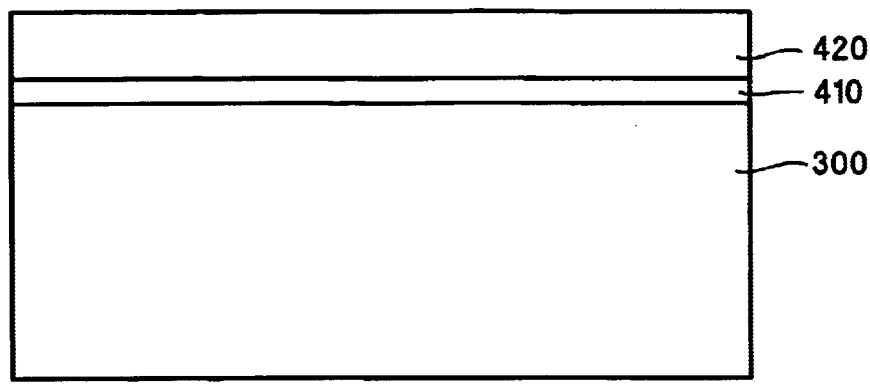
FIG. 4 shows a substrate in which an oxide layer and a nitride layer have been deposited.

FIG. 4 shows a substrate 300 in which a silicon oxide layer 410 has been thermally grown and a silicon nitride layer 420 has been deposited. Thermally growing silicon oxide is well known in the art of semiconductor processing. The silicon nitride layer is deposited through a low pressure chemical vapor deposition (LPCVD) process. LPCVD is well known in the art of semiconductor processing.

Figure 5:
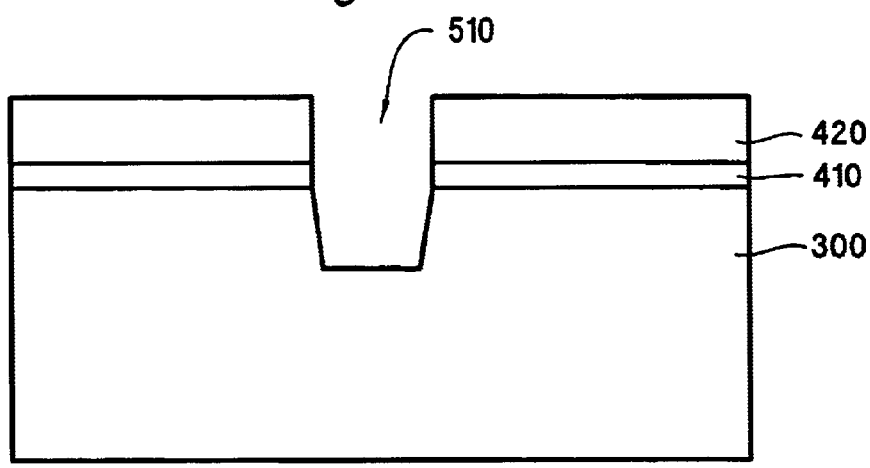
FIG. 5 shows a first trench having been etched through the oxide layer, the nitride layer land into the substrate.

FIG. 5 shows a trench 510 having been etched through the oxide layer 410, the nitride layer 420 and into the substrate 300. The shape and location of the trench are determined through photo lithography. Photo lithography generally includes the deposition and removal of a resist layer. Photo lithography is well known in the art of semiconductor processing.

Figure 6:
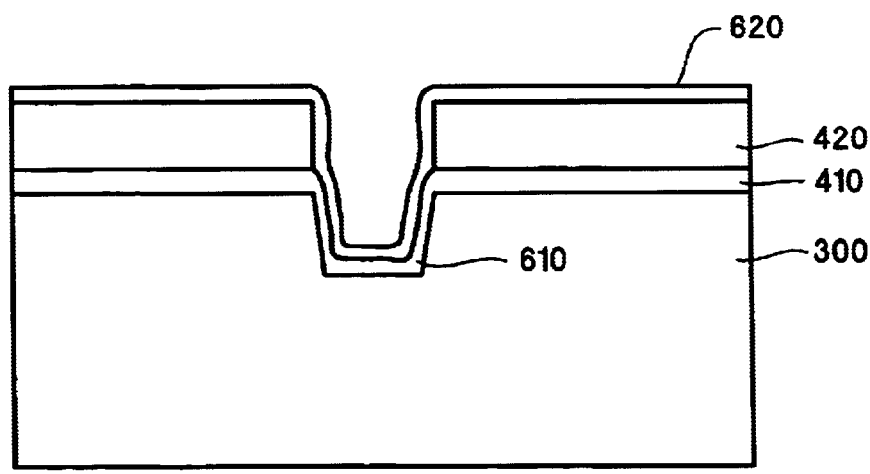
FIG. 6 shows an oxide layer grown on a substrate surface exposed during the formation of the first trench.

FIG. 6 shows an oxide layer 610 grown on a surface of the substrate 300 exposed during the formation of the trench 510. A nitride layer 620 is deposited over the oxide layer 610 and the nitride layer 420. Again, the oxide layer 610 is thermally grown. The nitride layer 620 is generally deposited using LPCVD.

Figure 7:
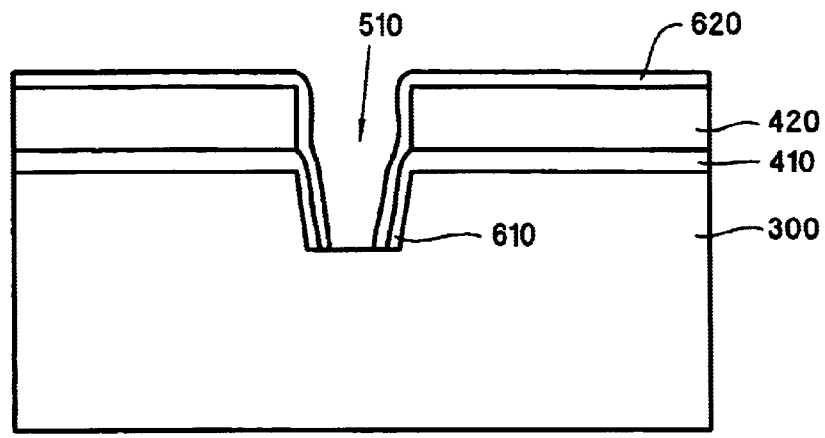
FIG. 7 shows the nitride layer and the oxide layer having been etched at the bottom of the first trench.

FIG. 7 shows the nitride layer 620 and the oxide layer 610 having been etched exposing the bottom of the trench 510. The oxide layer 610 is generally dry etched.

Figure 8:
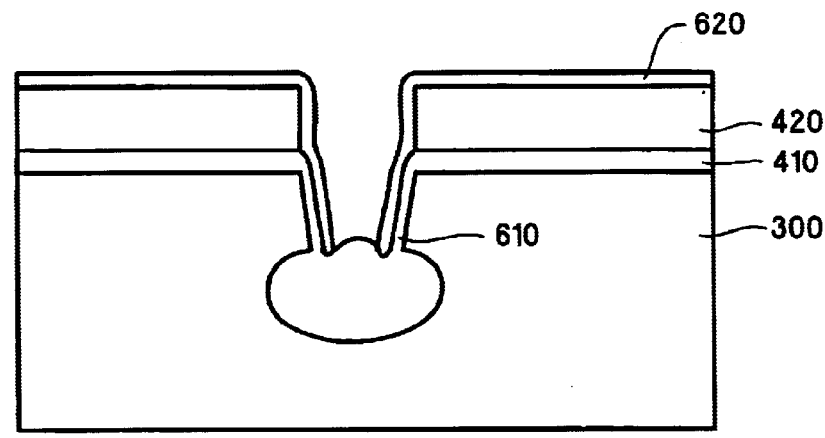
FIG. 8 shows the exposed substrate at the bottom of the first trench having been directly oxidized.

FIG. 8 shows the exposed substrate at the bottom of the trench having been directly oxidized. Again, the direct oxidation is typically thermally grown.

Figure 9:
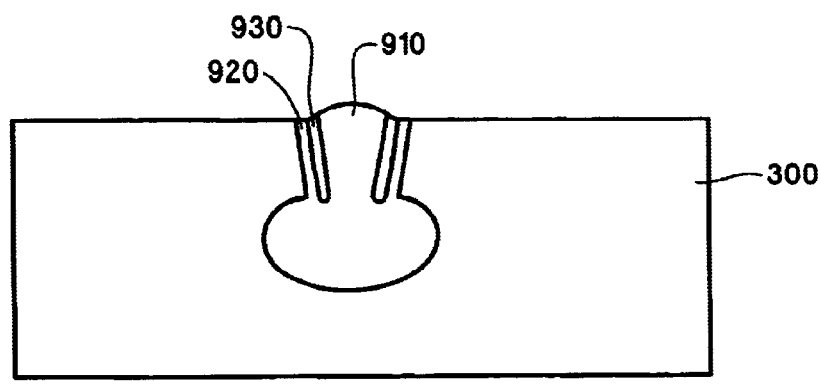
FIG. 9 shows the first trench having been filled with an oxide and then polished down to the surface of the substrate.

FIG. 9 shows the trench having been filled with an oxide 910 and then polished down to the surface of the substrate 300. The remaining portions of the nitride layer 620 and the oxide layer 610 form shallow region walls 920, 930. The oxide 910 is generally deposited by LPCVD. The oxide 910 is polished by a chemical mechanical polish (CMP) process. The shallow region wall 920 corresponds with the second wall material 330 of the embodiment shown in FIG. 3. The shallow region wall 930 corresponds with the first wall material 320 of the embodiment shown in FIG. 3.

Figure 10:
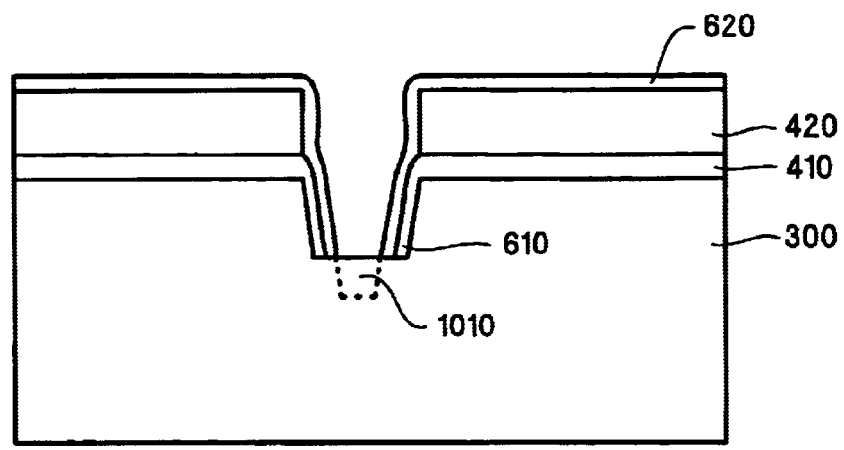
FIG. 10 shows the trench formed by the processing step of FIG. 7, in which a second trench is etched further into the exposed substrate at the bottom of the first trench.
Figure 11:
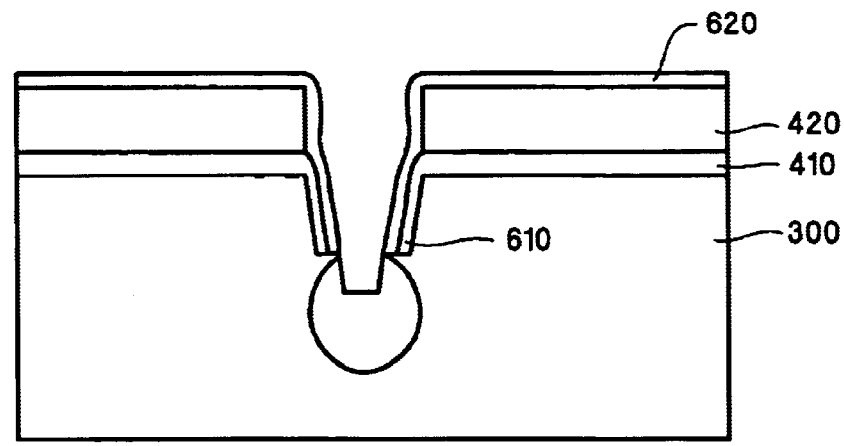
FIG. 11 shows the exposed substrate at the bottom of the second trench having been directly oxidized.
Figure 12:
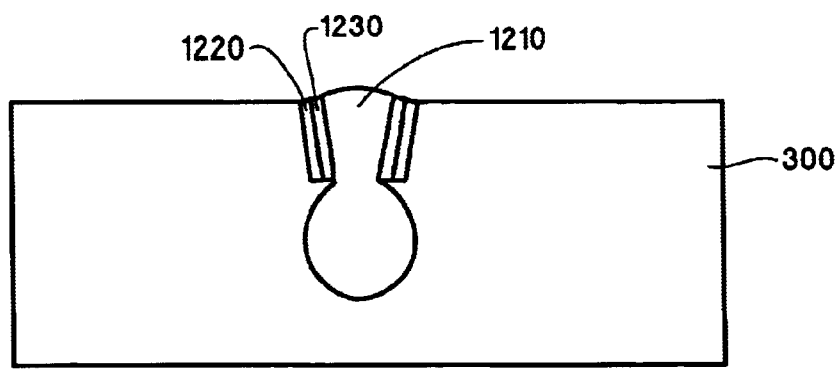
FIG. 12 the first trench and the second trench having been filled with an oxide and then polished down to the surface of the substrate 300.

FIGS. 10–12 show the processing steps of an alternate embodiment of the invention.

FIG. 10 shows the trench formed by the processing step of FIG. 7, in which a second trench 1010 is etched further into the exposed substrate at the bottom of the original trench. Again, the shape and location of the second trench 1010 are determined through photo lithography. The second trench 1010 is generally formed by a dry etch process.

FIG. 11 shows the exposed substrate at the bottom of the second trench 1010 having been directly oxidized. Again, the direct oxidation is typically thermally grown.

FIG. 12 both trenches 510, 1010 having been filled with an oxide 1210 and then polished down to the surface of the substrate 300. The remaining portions of the nitride layer and the oxide layer 610 form shallow region walls 1220, 1230. The oxide 1210 is generally deposited by LPCVD. The oxide 1210 is polished by a chemical mechanical polish (CMP) process. The shallow region wall 1220 corresponds with the second wall material 330 of the embodiment shown in FIG. 3. The shallow region wall 1230 corresponds with the first wall material 320 of the embodiment shown in FIG. 3.

Although specific embodiments of the invention have been described and illustrated, the invention is not to be limited to the specific forms or arrangements of parts so described and illustrated. The invention is limited only by the claims.

What is claimed is:

1. A semiconductor isolation structure comprising:
   a substrate, the substrate comprising a surface;
   a first device and a second device formed within the substrate;
   an isolation region formed within the substrate between the first device and the second device, the isolation region comprising:
      a single deep region which extends into the substrate, the deep region comprising a deep region cross-sectional area, the deep region abutting only the substrate and a single shallow region;
      the single shallow region extending to the surface of the substrate, the shallow region comprising:
         a protective outer wall adjacent to the substrate and extending to the surface of the substrate;
         an inner sealing wall located exclusively within the shallow region and adjacent to the protective outer wall, extending to th surface of the substrate; and
         the shallow region having a shallow region cross-sectional area;
   wherein the deep region cross-sectional area is greater than the shallow region cross-sectional area, the deep region abutting only a single shallow region.

2. The semiconductor isolation structure as recited in claim 1, wherein the isolation region comprises an oxide.

3. The semiconductor isolation structure as recited in claim 1, wherein the protective outer wall comprises a layer of oxide.

4. A semiconductor isolation structure comprising:
   a substrate, the substrate comprising a surface;
   a first device and a second device formed within the substrate;
   an isolation region formed within the substrate between the first device and the second device, the isolation region comprising:
      a single deep region which extends into the substrate, the deep region comprising an oxide, the deep region abutting only the substrate and a single shallow region;
      the shallow region extending to the surface of the substrate, the shallow region comprising:
         a protective outer wall adjacent to the substrate and extending to the surface of the substrate,
         an inner sealing wall located exclusively within the shallow region and adjacent to the protective outer wall, extending to the surface of the substrate.

5. The semiconductor isolation structure of claim 4, in which the protective outer wall comprises an oxide and the inner sealing wall comprises a nitride.

* * * * *